(12) United States Patent
Huang

(10) Patent No.: US 6,200,844 B1
(45) Date of Patent: Mar. 13, 2001

(54) METHOD OF MANUFACTURING DIELECTRIC FILM OF CAPACITOR IN DYNAMIC RANDOM ACCESS MEMORY

(75) Inventor: Kuo-Tai Huang, Hsinchu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/249,503

(22) Filed: Feb. 12, 1999

(51) Int. Cl.$^7$ .................................................. H01L 21/8234
(52) U.S. Cl. ............................................ 438/238; 438/238
(58) Field of Search .................................... 438/238, 239, 438/253, 308, 378, 396, 502, 791, 762, 254, 240, 397

(56) References Cited

U.S. PATENT DOCUMENTS

| | | | |
|---|---|---|---|
| 5,663,087 | * | 9/1997 | Yokozawa .............................. 438/762 |
| 5,846,859 | * | 12/1998 | Lee ........................................ 438/253 |
| 5,917,213 | * | 6/1999 | Iyer et al. ............................ 257/309 |
| 6,057,189 | * | 5/2000 | Huang et al. ......................... 438/253 |

\* cited by examiner

Primary Examiner—David Nelms
Assistant Examiner—David Nhu
(74) Attorney, Agent, or Firm—Blakely Sokoloff Taylor & Zafman

(57) ABSTRACT

A method of manufacturing a dielectric film for a capacitor in a DRAM. A native oxide layer is removed using a rapid ramp process at a pressure lower than $10^{-5}$ torr. A nitridation is performed to form a dielectric layer on the surface of a storage electrode. A silicon nitride layer is formed on the dielectric layer. The rapid ramp process is started at a temperature of about 450–550° C. The temperature is raised at a rate of about 80–120° C./minute. The rapid ramp process is stopped at about 700–850° C. The nitridation is performed using a source gas, such as ammonia at about 700–850° C. for a relatively long time of about 10–60 minutes. The dielectric layer includes silicon nitride or silicon-oxy-nitride. An oxide layer is further formed on the silicon nitride layer. The oxide layer is formed by, for example, a rapid thermal process. A gas used in the rapid thermal process can be selected from a group including nitrogen monoxide ($N_2O$), oxygen and combinations of nitrogen monoxide ($N_2O$) and oxygen. The dielectric film structure of the capacitor of the invention can be a double-layer structure such as silicon nitride/silicon oxide or a mono-layer structure, such as silicon nitride.

20 Claims, 3 Drawing Sheets

METHOD OF MANUFACTURING DIELECTRIC FILM OF CAPACITOR IN DYNAMIC RANDOM ACCESS MEMORY

BACKGROUND OF THE INVENTION

1. Field of the Invention

The invention relates in general to a method of manufacturing a dielectric film of a capacitor in a dynamic random access memory (DRAM), and more particularly to a method for improving the charge storage ability of the capacitor.

2. Description of the Related Art

Typically, a single DRAM cell comprises a metal-oxide-semiconductor (MOS) and a capacitor used to store signals therein. As more charges stored in the capacitor, the less the effect of the noise is when the data are read by a reading amplifier. Additionally, the refreshing frequency is reduced as the charges stored in the capacitor are increased. Currently, the method of increasing the charges storage ability includes: (1) increasing the surface of the capacitor to increase the amount of the charges stored in the capacitor, but this decreases the integration of the DRAM; (2) choosing a proper dielectric material to form a dielectric layer of the capacitor with a relatively high permittivity to increase the amount of the charges stored per unit surface area of the capacitor; and (3) decreasing the thickness of the dielectric layer.

Conventionally, the dielectric film of the capacitor is an oxide-nitride-oxide (ONO) dielectric layer, which is a sandwich structure of an oxide layer, a silicon nitride layer and an oxide layer. The method of forming the ONO dielectric layer comprises the steps of forming a native oxide layer on the lower electrode, which is the storage electrode, and forming a silicon nitride layer on the oxide layer. An oxide layer is formed on the silicon nitride layer. The native oxide layer is naturally formed and cannot be easily removed. The dielectric constant of the native oxide layer is lower than the dielectric contact of the nitride layer. The dielectric constant of the dielectric film of the capacitor thus cannot be decreased.

SUMMARY OF THE INVENTION

The invention provides a method of manufacturing a dielectric film for a capacitor in a DRAM. In the invention, the native oxide layer is removed using a rapid ramp process at a pressure lower than $10^{-5}$ torr. A nitridation is performed to form a dielectric layer on the surface of a storage electrode. A silicon nitride layer is formed on the dielectric layer. The rapid ramp process is started at a temperature of about 450–550° C. The temperature is raised at a rate of about 80–120° C./minute. The rapid ramp process is stopped at about 700–850° C. The nitridation is performed using a source gas, such as ammonia at about 700–850° C. for a relatively long time of about 10–60 minutes. The dielectric layer comprises silicon nitride or silicon-oxy-nitride. An oxide layer is further formed on the silicon nitride layer. The oxide layer is formed by, for example, a rapid thermal process. A gas used in the rapid thermal process can be selected from a group comprising nitrogen monoxide ($N_2O$), oxygen and combinations of nitrogen monoxide ($N_2O$) and oxygen. The dielectric film structure of the capacitor of the invention can be a double-layer structure, such as silicon nitride/silicon oxide or a mono-layer structure, such as silicon nitride.

The method of the invention removes a native layer on the storage electrode in a short time. The method of the invention thus has a low thermal budget. Moreover, the nitration process is performed on the surface of the storage electrode without the native layer to prevent another native layer forming, on the storage electrode. The dielectric film formed according to the invention has no native layer so that the dielectric constant of the capacitor is increased and the capacitance stored in every unit area is increased.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

FIGS. 1A through 1F are schematic, cross-sectional views of the process for manufacturing a dielectric film of a capacitor in one preferred embodiment of the invention. Reference will now be made in detail to the present preferred embodiment of the invention, an example of which is illustrated in the accompanying drawings.

Figure 1A:
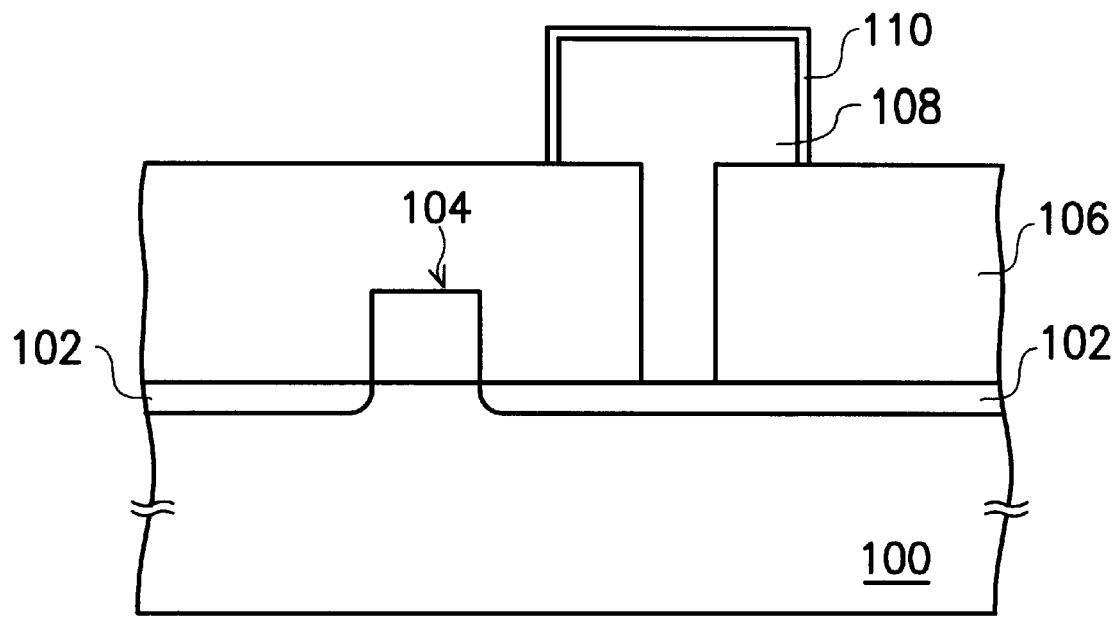
FIGS. 1A through 1F are schematic, cross-sectional views of the process for manufacturing a dielectric film of a capacitor in one preferred embodiment of the invention.

In FIG. 1A, a substrate 100 is provided. A MOS transistor 104 and an insulating layer 106 are formed on the substrate 100. A storage electrode 108 of a capacitor contacts of the source/drain regions 102 of the MOS transistor 104 through the insulating layer 106. A material of the storage electrode 108 comprises polysilicon. The preferred structure of the storage electrode 108 comprises hemispherical grained (HSG) structure. In the preferred embodiment, the shape of the storage electrode 108 is denoted as a columnar type.

The storage electrode 108 is formed by, for example, chemical vapor deposition. Since the surface of the storage electrode 108 is exposed in an oxygen-rich environment, a part of the storage electrode 108 is naturally oxidized to form a thin native oxide layer 110 thereon.

Figure 1B:
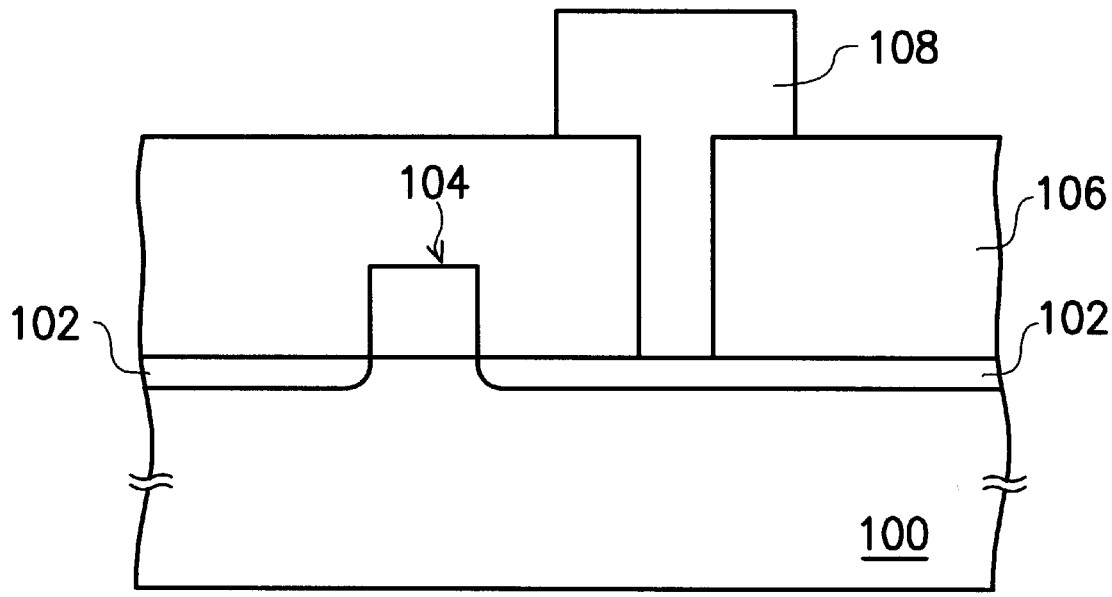

In FIG. 1B, the native oxide layer 110 is removed to expose the surface of the storage electrode 108 in a rapid ramp process. The rapid ramp process is performed at a pressure of about $10^{-5}$ torr. A starting temperature of the rapid ramp process is about 450–550° C. A reaction is carried out, as shown below:

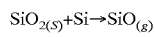

$$SiO_{2(s)} + Si \rightarrow SiO_{(g)}$$

where (s) means solid and (g) means gas.

The temperature of the rapid ramp process is raised about 80–120° C. every minute until the temperature achieves about 700–850° C. Since the product SiO is gasiform, it can be aspirated by a vacuum pump. According to increasing the temperature, the reaction rate increases in accordance with the increasing temperature. The native oxide layer 110 is completely removed in about 1–5 minutes. The time required to remove the native oxide layer 110 is short. The rapid ramp process thus has a low thermal budget.

Figure 1C:
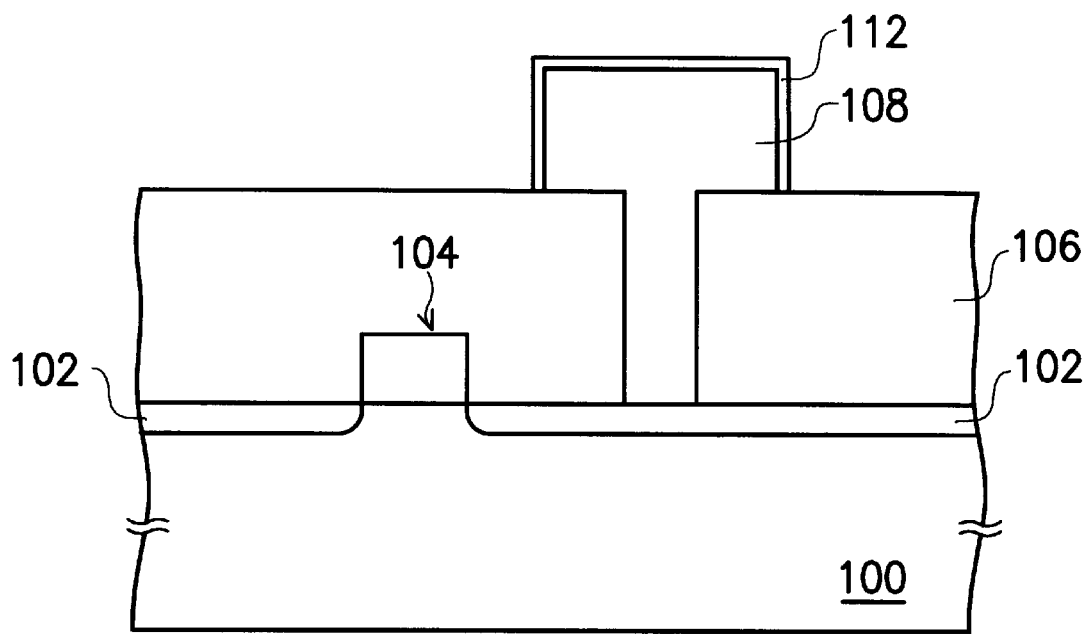

In FIG. 1C, a nitridation is performed to prevent another native oxide layer from forming on the storage electrode 108 and to form dielectric film 112, such as a silicon nitride layer or a silicon-oxy-nitride layer, on the storage electrode 108 in about 10–60 minutes. The nitridation is performed at about 700–850° C. using a gas, such as ammonia. It should be noted that the rapid ramp process and the nitridation are performed in the same reactive room. If the nitridation is performed in another reactive room, the substrate 100 must be transported in an oxygenless environment.

Figure 1D:
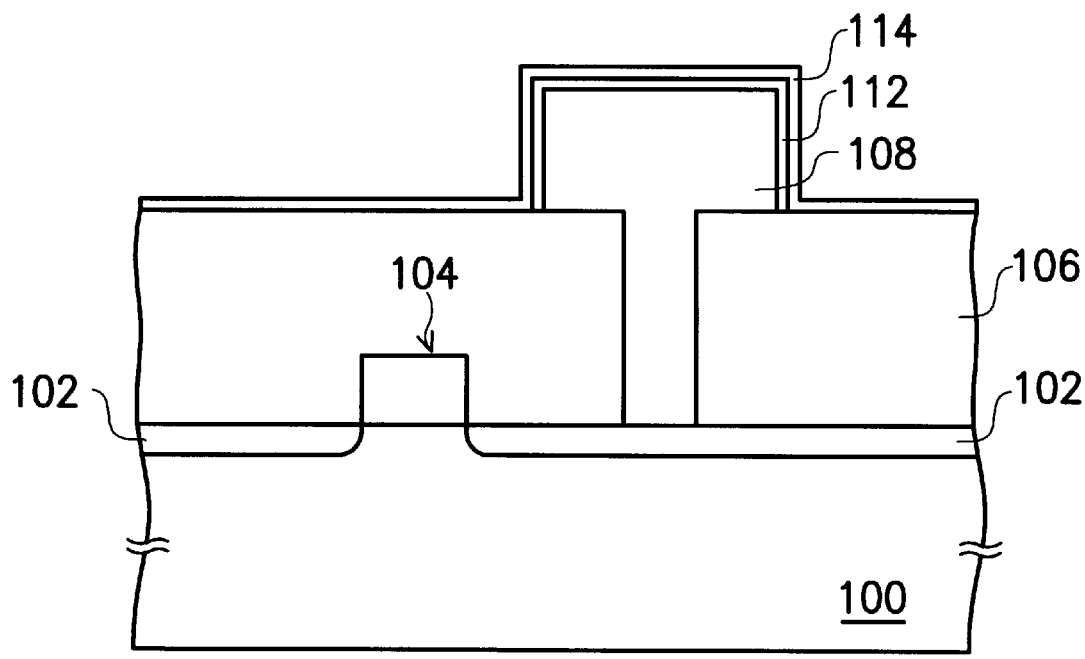

In FIG. 1D, a silicon nitride layer 114 is formed on the dielectric film 112. The step is performed, for example, using a mixture gas comprising dichloro-silane ($SiH_2Cl_2$) and ammonia in a furnace, using a mixture gas comprising tetrachloro-silane ($SiCl_4$) and ammonia in a furnace, or using the mixture gas comprising dichloro-silane ($SiH_2Cl_2$) and ammonia for a rapid thermal process.

Figure 1E:
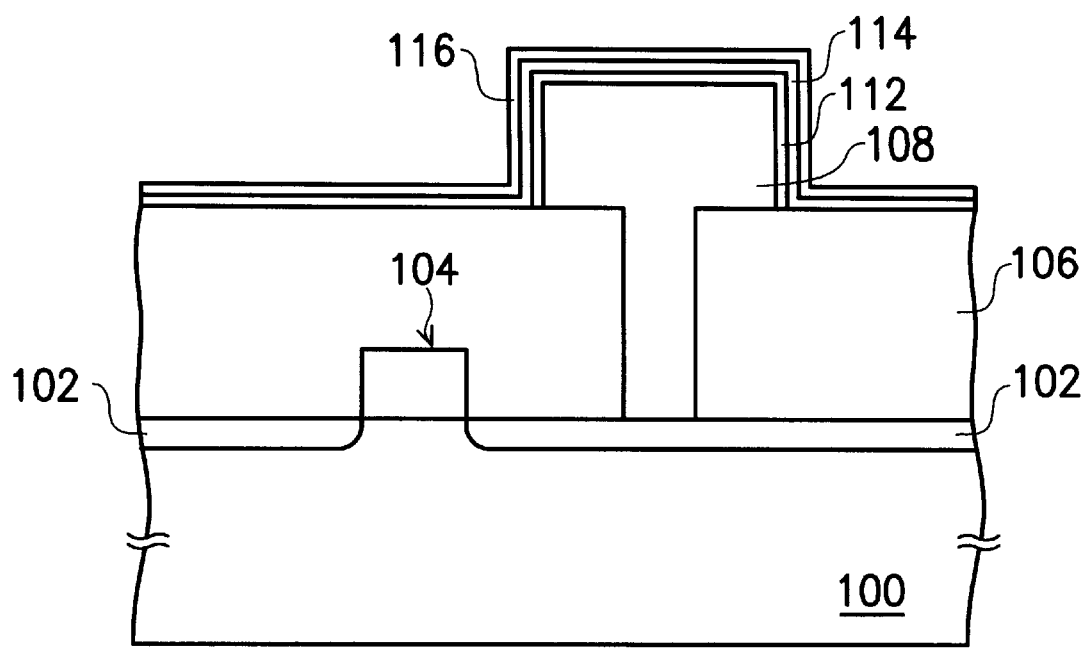

In FIG. 1E, a rapid thermal process is performed to form an oxide layer 116 on the silicon nitride layer 114. A gas used in the rapid thermal process can be selected from a group comprising nitrogen monoxide ($N_2O$), oxygen and combinations of nitrogen monoxide ($N_2O$) and oxygen.

The oxide layer 116 can decrease defects in the silicon nitride layer 114. Moreover, since the oxide layer 116 is formed by the rapid thermal process, oxygen cannot diffuse to the interface between the silicon nitride layer 114 and the storage electrode 108 to form silicon oxide.

Notice that the oxide layer 116 is used to decrease the defects of the silicon nitride layer 114. If the silicon nitride layer 114 is formed using a mixture gas comprising tetrachloro-silane ($SiCl_4$) and ammonia in the furnace, the silicon nitride layer 114 has a smooth surface. The step of forming the oxide layer 116 thus can be eliminated. The dielectric film of the capacitor according to the invention is an NO layer or an N layer. The native oxide layer 110 is removed so that the dielectric constant of the dielectric film is increased.

Figure 1F:
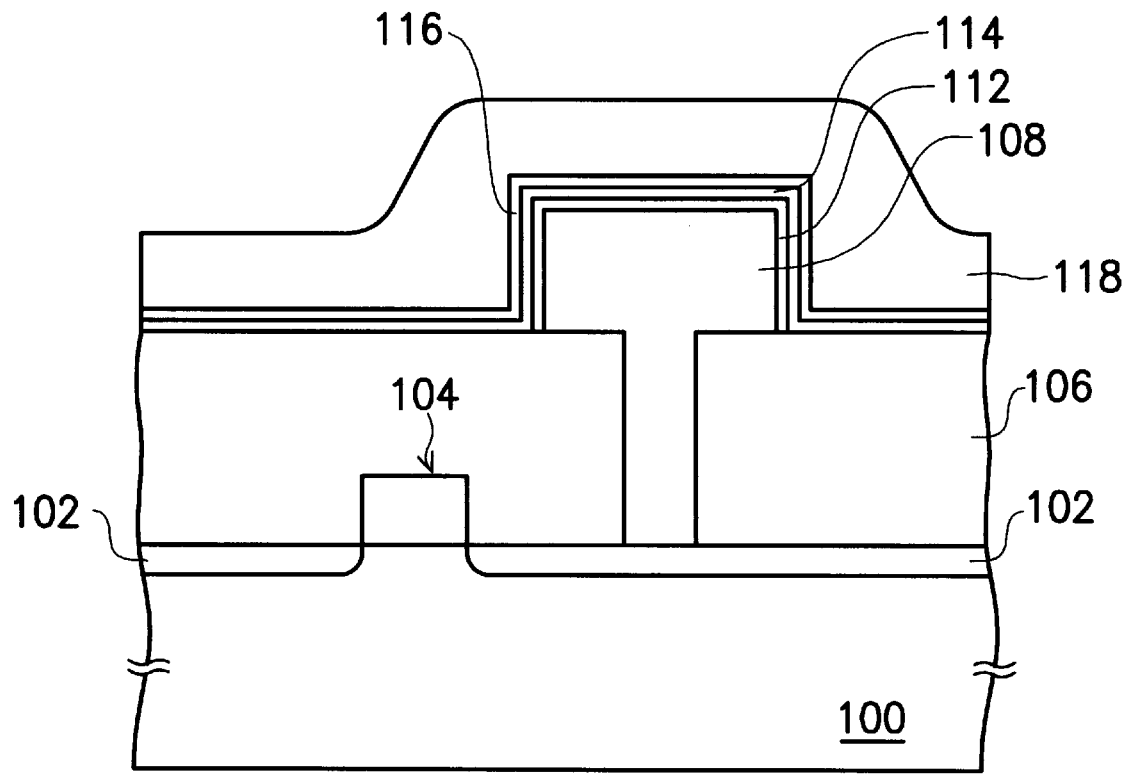

In FIG. 1F, a conductive layer 118 is formed on the dielectric film to use as an upper electrode of the capacitor. A material of the conductive layer 118 comprises doped polysilicon, titanium nitride (TiN)/doped polysilicon, tungsten nitride (WN)/doped polysilicon and tantalum nitride (TaN)/doped polysilicon. While operating the capacitor, a depletion region formed in the capacitor is inhibited using titanium nitride (TiN)/doped polysilicon, tungsten nitride (WN)/doped polysilicon or tantalum nitride (TaN)/doped polysilicon as the upper electrode. Furthermore, the capacitance of the capacitor is about 2 fF/cell or larger.

A feature of the invention is that a native oxide layer 110 on the storage electrode 108 is removed using a rapid ramp process at a pressure of about $10^{-5}$ torr. A temperature of the rapid ramp process is about 450–550° C. and is raised at a rate of about 80–120° C. every minute until the temperature reaches about 700–850° C.

Another feature of the invention is that a nitridation is performed on the storage electrode 108 to prevent another native oxide layer from forming on the surface of the storage electrode 108.

Yet another feature of the invention is that a rapid ramp process is performed for a short time. The thermal budget of the process to form a capacitor is thus low.

Still another feature of the invention is that the dielectric film can be a mono-layer structure, such as a silicon nitride layer, or a double-layer structure, such as a silicon nitride/oxide layer.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of manufacturing a dielectric film of a capacitor in a dynamic random access memory, in which the dielectric film is suitable for formation on a storage electrode, the method comprising steps of:
   performing a rapid ramp process to remove the native oxide layer so as to expose the storage electrode;
   performing nitridation to form a dielectric layer on the storage electrode; and
   forming a silicon nitride layer on the dielectric layer.

2. The method according to claim 1, wherein the rapid ramp process is performed at a pressure of about $10^{-5}$ torr or less.

3. The method according to claim 1, wherein a temperature of the rapid ramp process is raised at a rate of about 80–120° C./minute.

4. The method according to claim 3, wherein the rapid ramp process is started at about 450–550° C. and ended at about 700–850° C.

5. The method according to claim 1, wherein the nitridation is performed using ammonia at about 700–850° C. for about 10–60 minutes.

6. The method according to claim 5, wherein a material of the dielectric layer is selected from a group comprising silicon nitride and silicon-oxy-nitride.

7. The method according to claim 6, wherein an oxide layer is further formed on the dielectric layer when the material of the dielectric layer is silicon nitride.

8. The method according to claim 7, wherein the oxide layer is formed by a rapid thermal process using a gas selected from a group comprising nitrogen monoxide ($N_2O$), oxygen and combinations of nitrogen monoxide ($N_2O$) and oxygen.

9. The method according to claim 5, wherein the silicon nitride is formed using a mixture gas comprising tetrachloro-silane ($SiCl_4$) and ammonia in a furnace.

10. The method according to claim 5, wherein the silicon nitride is formed using a mixture gas comprising dichloro-silane ($SiH_2Cl_2$) and ammonia in a furnace.

11. The method according to claim 5, wherein the silicon nitride is formed by a rapid thermal process using a mixture gas comprising dichloro-silane ($SiH_2Cl_2$) and ammonia.

12. The method according to claim 9, wherein an upper electrode, which is selected from a group consisting of doped polysilicon, titanium nitride (TiN)/doped polysilicon, tungsten nitride (WN)/doped polysilicon and tantalum nitride (TaN)/doped polysilicon, is further formed on the silicon nitride layer.

13. The method according to claim 10, wherein an upper electrode, which is selected from a group consisting of doped polysilicon, titanium nitride (TiN)/doped polysilicon, tungsten nitride (WN)/doped polysilicon and tantalum nitride (TaN)/doped polysilicon, is further formed on the oxide layer.

14. The method according to claim 11, wherein an upper electrode, which is selected from a group consisting of doped polysilicon, titanium nitride (TiN)/doped polysilicon, tungsten nitride (WN)/doped polysilicon and tantalum nitride (TaN)/doped polysilicon, is further formed on the oxide layer.

15. A method of removing a native oxide layer, comprising performing a rapid ramp process at a pressure of about $10^{-5}$ torr, wherein a temperature of the rapid ramp process is about 450–550° C. and is raised at a rate of about 80–120° C. every minute.

16. The method according to claim 15, wherein the rapid ramp process is stopped until the temperature of the rapid ramp process reaches to about 700–850° C.

17. A method to manufacture a dielectric film of a capacitor in a dynamic random access memory where the dielectric film is suitable for formation on a storage electrode, the method comprising:

presenting the storage electrode having a native oxide layer disposed thereon;

exposing the storage electrode by performing a rapid ramp process to remove the native oxide layer;

forming a dielectric layer on the storage electrode by performing nitridation;

employing a mixture gas to form a silicon nitride layer on the dielectric layer, wherein the mixture gas includes dichloro-silane ($SiH_2Cl_2$) and ammonia; and forming an oxide layer on the silicon nitride layer.

18. The method of claim 17, further comprising:

forming an upper electrode on the oxide layer, wherein the upper electrode is selected from a group consisting of doped polysilicon, titanium nitride (Ti/N)/doped polysilicon, tungsten nitride (WN)/doped polysilicon, and tantalum nitride (TaN)/doped polysilicon.

19. A method to manufacture a dielectric film of a capacitor in a dynamic random access memory where the dielectric film is suitable for formation on a storage electrode, the method comprising:

presenting the storage electrode having a native oxide layer disposed thereon;

exposing the storage electrode by performing a rapid ramp process to remove the native oxide layer;

forming a dielectric layer on the storage electrode by performing nitridation; and employing a mixture gas to form a silicon nitride layer on the dielectric layer, wherein the mixture gas includes tetrachloro-silane ($SiCl_4$) and ammonia.

20. The method of claim 19, further comprising:

forming an upper electrode on the silicon nitride layer, wherein the upper electrode is selected from a group consisting of doped polysilicon, titanium nitride (Ti/N)/doped polysilicon, tungsten nitride (WN)/doped polysilicon, and tantalum nitride (TaN)/doped polysilicon.

* * * * *